United States Patent

Badger

[11] 3,944,952
[45] Mar. 16, 1976

[54] FINE TUNING SYSTEM HAVING A LIMITED USER ADJUSTABLE TUNING RANGE

[75] Inventor: Joe G. Badger, Bloomington, Ind.

[73] Assignee: Sarkes Tarzian, Inc., Bloomington, Ind.

[22] Filed: Oct. 24, 1974

[21] Appl. No.: 517,460

[52] U.S. Cl. .................... 334/39; 334/51; 334/57; 334/76; 334/89
[51] Int. Cl.² .................. H03J 1/06; H03J 5/10
[58] Field of Search .......... 334/51, 57, 58, 39, 88, 334/89, 70, 74, 76; 74/10.2, 10.41; 336/136

[56] References Cited
UNITED STATES PATENTS

| | | | |
|---|---|---|---|
| 2,604,791 | 7/1952 | Daly | 74/10.41 |
| 2,995,719 | 8/1961 | Osborn et al. | 336/136 |
| 3,182,516 | 5/1965 | Rapata | 334/74 |
| 3,183,726 | 5/1965 | Badger | 334/51 |
| 3,316,770 | 5/1967 | Badger et al. | 74/10.8 |

*Primary Examiner*—Alfred E. Smith
*Assistant Examiner*—Wm. H. Punter
*Attorney, Agent, or Firm*—Mason, Kolehmainen, Rathburn & Wyss

[57] ABSTRACT

A limited tuning range tuning unit useable with a television tuner of the turret type includes a user tunable coil having a tuning slug extending from an end of the tuning unit. A pinion gear engageable by a drive train coupled to a user operated fine tuning shaft is attached to the end of the tuning slug. The pinion gear is provided with a stop tooth for limiting the adjustment range of the slug to approximately one revolution. In one embodiment, the slug is also longitudinally movable with respect to a coil in the coil unit to provide a factory adjustment for centering the tuning range available to the user. Alternatively, the factory adjustment may be provided by making the slug rotatable with respect to the pinion gear.

20 Claims, 10 Drawing Figures

FINE TUNING SYSTEM HAVING A LIMITED USER ADJUSTABLE TUNING RANGE

BACKGROUND OF THE INVENTION

This invention relates generally to television tuners and, more particularly, to tuners of the so-called memory fine tuning type wherein the fine tuning range is limited.

Present day television tuners of the rotary type include an incrementally rotatable channel selector for selectively connecting certain ones of a plurality of tuned circuit elements into operative relationship with other tuner elements for each of a plurality of channel selector positions. Because of the difficulty in accurately setting the values of tuned circuit elements, and because of the desirability of accurately tuning the local oscillator for clear reception in each of the channel positions of the station selector shaft, it is customary to include an adjustable impedance device in the oscillator circuit. This impedance device is conventionally adjusted by means of a vernier or fine tuning mechanism selectively connectable to the impedance device by the viewer.

When a memory type fine turning system is employed, a separate impedance device is provided for each of the channel selector positions. The separate impedance devices may be switched into operative relationship with the tuner by means of a wafer switch; or a turret employing a plurality of tuning sticks, each having a separate impedance device, may be used. When such a turret is employed, each of the tuning sticks is sequentially rotated into position for engagement by the tuner to determine the receiving frequency of the tuner.

The tuning range of the impedance device is determined by a number of factors including the expected oscillator drift and, to a large extent, the expected variation in the values of the production components used to manufacture the tuner. As a result, only a fraction of the total tuning range is used to compensate for the oscillator drift, and most of the available tuning range is not used after the set has been shipped from the manufacturer. The unused tuning range can cause problems because it permits excessive detuning of the receiver by the user. Such excessive detuning has been found to be one of the major causes of calls for repair service, particularly when a memory type fine tuning is employed.

SUMMARY OF THE INVENTION

It is, therefore, an object of the present invention to provide a new and improved television tuner with an improved fine tuning arrangement having a limited user adjustable tuning range.

Another object of the present invention is to provide a new and improved memory fine tuning arrangement for a television tuner having a relatively broad factory adjustable tuning range to compensate for production tolerances and a relatively narrow user adjustable tuning range.

A further object of the present invention is to provide an improved limited range tuning unit for use with a turret tuner of the memory type.

In accordance with a preferred embodiment of the invention, a turret type tuner is provided with a plurality of tuning units mounted around the periphery of a turret. Each of the tuning units includes a variable impedance element selectively connectable in operative relationship to a local oscillator. Each variable impedance element contains a rotatable impedance adjusting device engageable by a user operated fine tuning mechanism for rotation thereby. A gear, engageable by the fine tuning mechanism is attached to each impedance adjusting device. The gear is provided with a stop tooth for limiting the range of rotation of the impedance adjusting device to approximately one revolution when the gear is engaged by the fine tuning mechanism. This effectively limits the user adjustable fine tuning range to the range of drift encountered as a result of normal component aging, oscillator drift and other changes occurring as a result of normal operation of the tuner.

In order to compensate for manufacturing variations, the impedance adjusting device is made axially movable with respect to the impedance device, the axial movement being effective to change the impedance of the impedance device. The tuning unit is adjusted in the factory by axially moving the impedance adjusting device with respect to the impedance unit, or by manually rotating the impedance adjusting device with the fingers or a special tuning tool. The factory adjustment compensates for the component and other variations and permits the user available tuning range to be restricted to a reduced range to compensate only for oscillator drift, component aging and other normally occurring changes. In an alternative embodiment, the impedance adjusting device is threaded into a threaded aperture in the gear and factory adjustment is provided by rotating the impedance adjusting device within the gear.

The invention, and its method of operation, together with further objects and advantages thereof, will best be understood by reference to the following sepcification taken in connection with the accompanying drawing in which.

DETAILED DESCRIPTION

Figure 1:
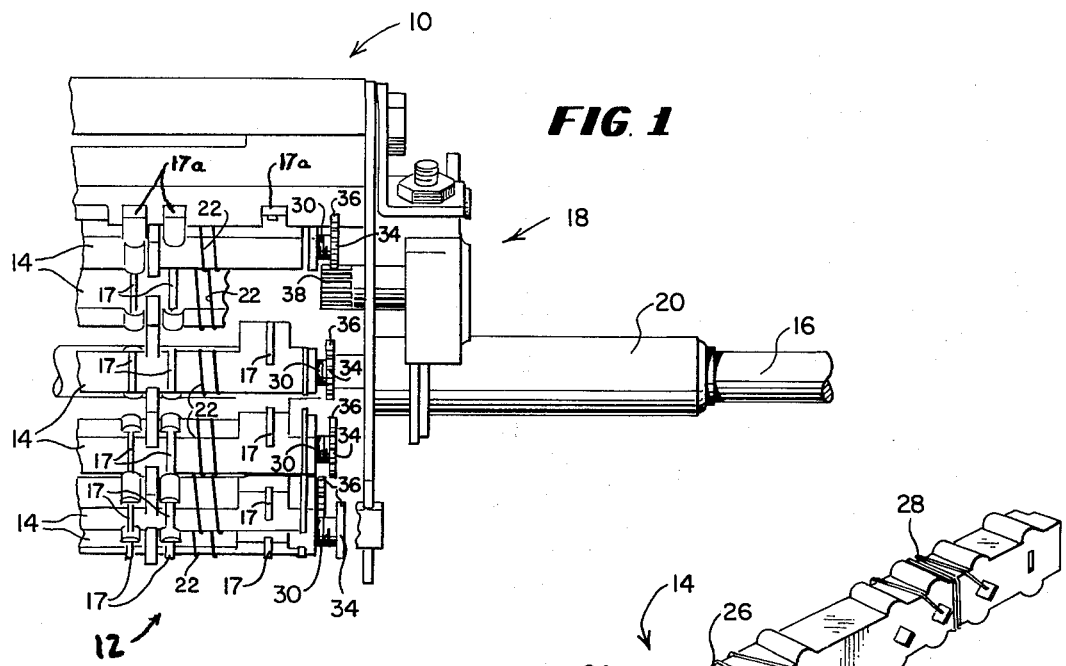
FIG. 1 is a partial side view of a turret type VHF tuner utilizing the tuning units according to the invention.

Referring now to the drawing, and particularly to FIG. 1, there is shown a VHF tuner 10 having a turret 12 containing a plurality of tuning units 14. The turret 12 is rotatable by means of a selector shaft 16 for selectively operatively connecting a predetermined one of the tuning units 14 to other components such as an oscillator and a mixer (not shown) of the tuner 10. Each of the tuning units 14 corresponds to one of the twelve VHF television channels, and channel selection is effectuated by rotating the turret until the tuning unit corresponding to a desired channel is brought into operative contact with the rest of the tuner circuitry. Electrical contact between the tuner 10 and the tuning units 14 is made by a set of contact members 17 extending from the tuning units 14. The contact members 17 selectively engage similar contact members 17a within the tuner 10. Fine tuning of each tuning unit is accomplished by a fine tuning mechanism 18 which selectively engages the coil unit operatively connected to the tuner, and fine tunes the tuning unit 14 in response to a rotation of a fine tuning shaft 20.

The operation of such a turret type tuner described up to this point is conventional. Examples of such tuners are illustrated in U.S. Pat. Nos. 3,183,726 and 3,316,770, assigned to the same assignee as the assignee of the present invention, and incorporated herein by reference.

Figure 2:
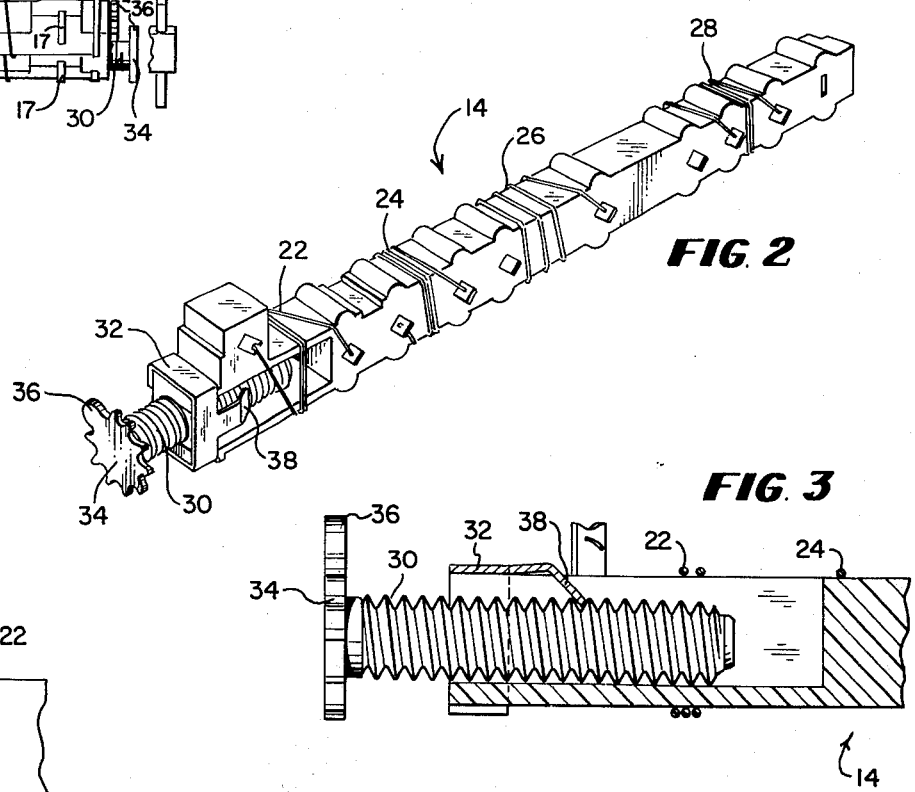
FIG. 2 is a perspective view of one of the tuning units according to the invention employed in the tuner of FIG. 1.

In accordance with a preferred embodiment of the invention, each of the improved tuning units 14 (FIGS. 1 and 2) contains a plurality of impedance elements, one of the impedance elements being tunable by the user over a limited range. In the embodiment shown in the drawing, the impedance elements include a tunable oscillator coil 22, and RF and mixer coils 24, 26 and 28. The coils 24, 26 and 28 each form a part of a relatively broad band network, and are fixed tuned. The oscillator coil 22 controls the frequency of the local oscillator and contains an adjustable tuning slug 30 for adjusting the local oscillator frequency. Alternatively, the coils 22, 24, 26 and 28 may be replaced by other impedance devices such as capacitors, and the tuning slug 30 may be replaced by other impedance adjusting means such as a tuning piston if a variable capacitor is used in place of the oscillator coil 22.

The tuning slug 30 is secured to the tuning unit 14 by a retaining clip 32. A gear 34 having a stop tooth 36 is attached to the end of the slug 30 extending from the tuning unit 14. The stop tooth 36 is larger than the other teeth of the gear 34 and limits the range of rotation of the gear 34 to less than one complete revolution when the gear 34 is engaged by the fine tuning mechanism 18. Although the stop tooth 36 is longer and wider than the other teeth, any variation in configuration, such as an increase in only the length or width, that prevents the gear 34 from being rotated more than one revolution may be used.

In operation, each of the gears 34 is selectively engaged by a driving pinion 38 forming part of the fine tuning mechanism 18. The driving pinion 38 selectively engages one of the gears 34 for rotation in response to the rotation of the fine tuning shaft 20. Only one of the gears 34 corresponding to the one of the tuning units 14 that is operatively connected to the tuner 10 may be engaged at any one time. The range over which the oscillator coil 22 may be tuned in this manner is limited by the stop tooth 36. The stop tooth 36 is wider than the space between the teeth in the driving pinion 38 and does not mesh with the pinion 38. Hence, the range of rotation of the gear 34 is limited to less than one revolution by the stop tooth 36. This limits the range over which the oscillator coil 22 may be tuned by the user to only the range necessary to compensate for oscillator drift and component aging.

A similar result may be obtained by providing the pinion 38 with a stop tooth, but placing the stop tooth on the pinion 38 does not provide an absolute limit on the range of rotation of the gears 34. When a stop tooth is placed on the pinion 38, the gear 34 may be rotated beyond the desired limit by repeatedly disengaging and reengaging the fine tuning mechanism 18 each time the limit is reached. In addition, a larger tooth or the pinion 38 could cause mistuning of the tuning units 14 during the channel changing operation by scuffing the gears 36 as the turret 12 is rotated.

Figure 3:
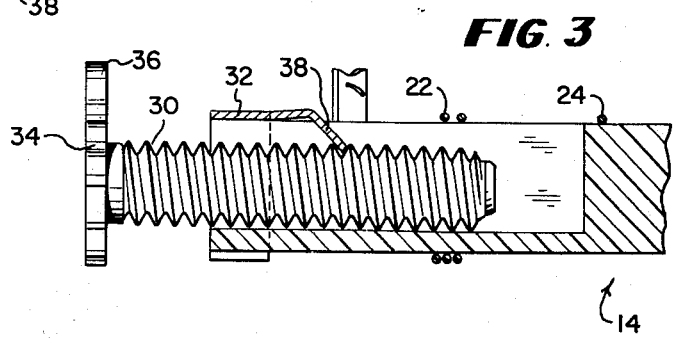
FIG. 3 is a partial sectional side view of the tuning unit of FIG. 2 showing one method of securing an impedance adjusting tuning slug within the tuning unit.

In order to compensate for component variations during production, the oscillator coil 22 may be tuned by rotating the gear 34 manually or with an appropriate tuning tool. Alternatively, the coil 22 may be tuned during production by moving the tuning slug 30 axially within the tuning unit 14. The axial movement of the tuning slug 30 may be accomplished in a variety of ways. In one embodiment, the mounting structure 32 may be provided with a resilient tab 38 (FIG. 3) engaging the threads of the slug 30. When such a mounting arrangement is employed, axial movement of the slug 30 may be achieved by applying axial pressure to the slug 30 to thereby cause the tab 38 to be radially deflected away from the threads. The radial deflection allows the tab 38 to jump threads, thereby permitting the tuning slug 30 to be incrementally shifted along its axis in response to axial pressure.

Figure 5:
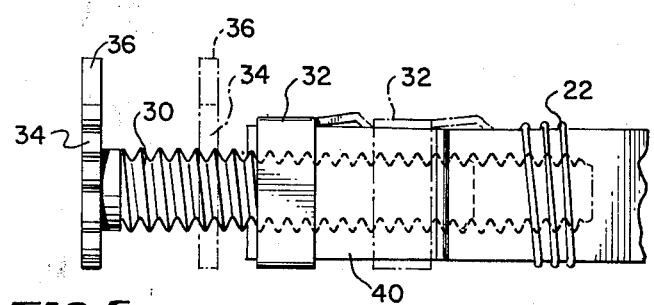
FIG. 5 is a partial side view showing an alternative method of mounting the impedance adjusting tuning slug within the coil unit.

In an alternative embodiment, the mounting clip 32 may be slideably mounted to an extension 40 of the tuning unit 14 (FIG. 5). When such an arrangement is used, the factory tuning is accomplished by sliding the clip 32 over the extension 40 until the coil 22 is tuned to a desired range of frequencies.

Figure 4:
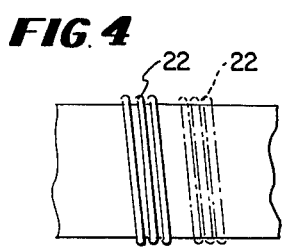
FIG. 4 is a partial side view of the tuning unit of FIG. 2 showing the impedance adjusting slug slidingly mounted to the tuning unit.

Because the reactance, and hence, the operating frequency of the oscillator coil 22 is determined by the relative position of the coil 22 and the tuning slug 30, factory adjustment of the operating frequency of the coil 22 may also be accomplished by sliding the windings of the coil 22 along the body of the tuning unit 14 as shown in FIG. 4. When this technique is employed, the coil 22 is wound around the body of the tuning unit 14 with sufficient slack to permit the coil 22 to be moved axially along the unit 14. The tuning unit 14 is then tuned by moving the coil 22 along the body of the tuning unit 14 until the desired inductance is achieved. Subsequent to tuning, the coil 22 is secured in place with an adhesive such as dope or cement to prevent subsequent mistuning. As a result, the factory tuning of the tuning unit 14 may be conveniently accomplished by moving either the coil 22 or the tuning slug 30, the choice of the tuning method being readily adaptable to changes in production techniques.

Figure 6:
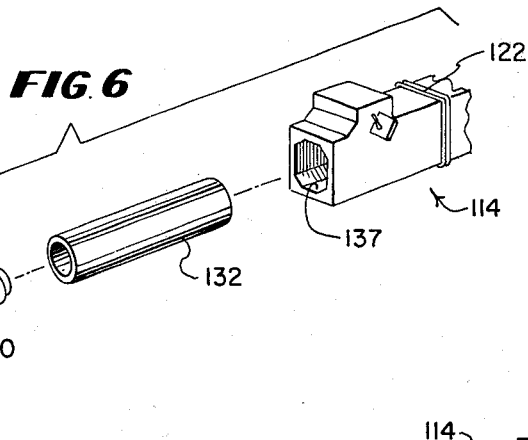
FIG. 6 is an exploded view of a tuning unit according to the invention showing another method of mounting the impedance adjusting tuning slug within the coil unit.
Figure 7:
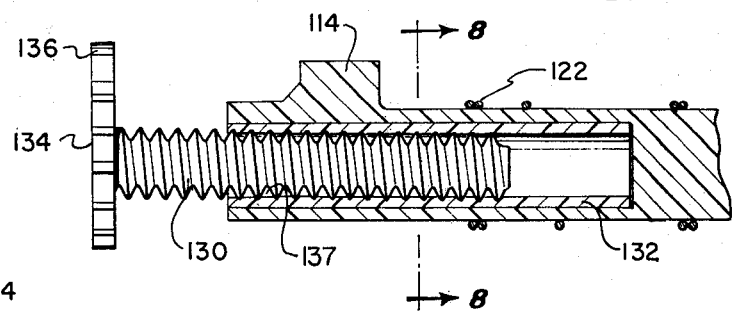
FIG. 7 is a side view, partially in cross section, of the embodiment shown in FIG. 6.
Figure 8:
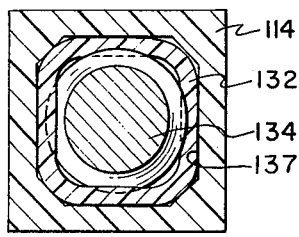
FIG. 8 is a cross-sectional view of the tuning slug mounting structure taken along line 8—8 of FIG. 7.

In the alternative embodiment of the invention shown in FIGS. 6, 7 and 8, an elongated hollow sleeve is used to slideably retain the tuning slug within the tuning stick. In the embodiment shown in FIGS. 6, 7 and 8, reference numerals from the hundreds series are utilized to designate the components, and components analagous to components in FIGS. 1–5 are designated with similar tens and units digits. In the embodiment shown in FIGS. 6, 7 and 8, a tuning slug 130 having a gear 134 and a stop tooth 136 is secured to one end of a tuning stick 114 by means of a retaining sleeve 132. The retaining sleeve 132 is fabricated from a flexible plastic or similar material and has an inside diameter smaller than the outside diameter of the tuning slug 130. An elongated chamber 137 having an eight sided cross section is provided in the end of the tuning stick 114 for receiving the retaining sleeve 132. The distance between opposing surfaces of the elongated chamber 137 is less than the outside diameter of the retaining sleeve 132. This causes the walls of the sleeve 132 to be compressed when the sleeve 132 is inserted into the chamber 137 and causes the sleeve to assume a generally retangular cross section as shown in FIG. 8. The tuning slug 130 is threaded into the sleeve 132, and the walls of the tuning slick 114 serve to maintain the walls of the sleeve 132 in engagement with the threads of the slug 130 as shown in FIG. 8.

The opposing walls of the chamber 137 are generally parallel to each other and slidingly engage the walls of the sleeve 132 in a friction fit. Factory adjustment is provided by applying axial pressure to the end of the tuning slug 130 to slide the sleeve 132 within the tuning stick 114 User adjustment is provided by rotating the slug 130 within the sleeve 132 in a fashion similar to that employed in the previously described embodiments. As in the previous embodiments, the threads formed in the interior wall of the sleeve 132 by the slug 130 cause the slug 130 to move axially with respect to an osciallator coil 122 upon rotation of the gear 134 by the fine tuning mechanism.

Figure 9:
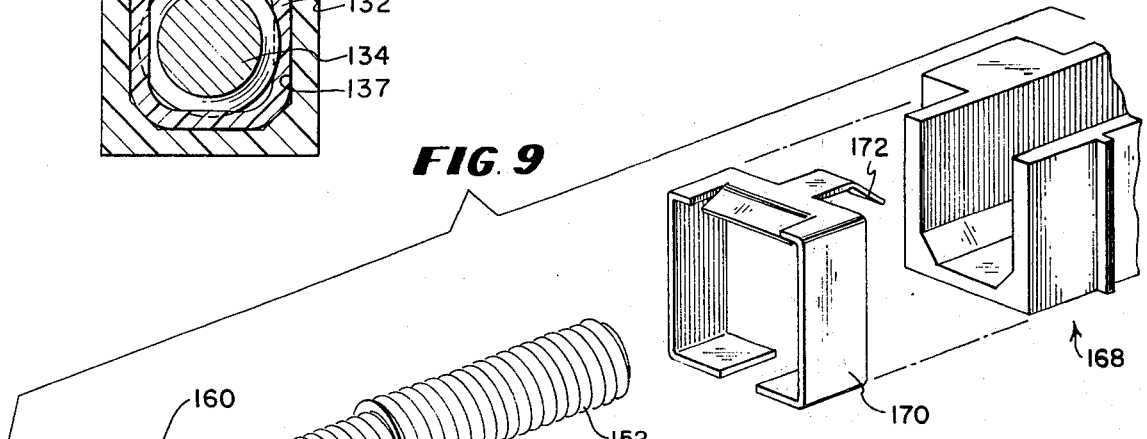
FIG. 9 is an exploded perspective view of one of the tuning units according to the invention showing an alternative method for providing factory adjustment of the unit.
Figure 10:
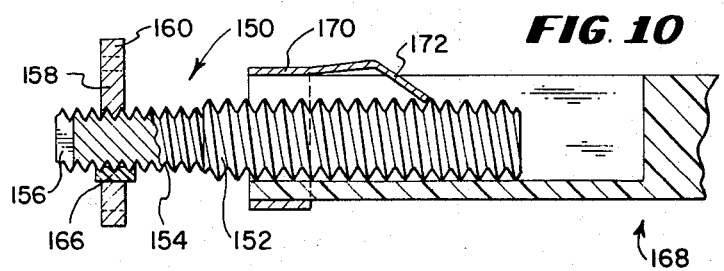
FIG. 10 is a cross-sectional side view of the tuning unit shown in FIG. 9.

In the embodiment shown in FIGS. 9 and 10, both factory adjustment and user adjustment of the oscillator coil are provided by a rotation of the tuning slug. A threaded tuning slug 150 having a relatively larger diameter threaded portion 152 and a relatively smaller diameter threaded portion 154 is employed. A screwdriver slot 156 is formed in the protruding end of the smaller diameter threaded portion 154. Although a screwdriver slot 156 is shown, other engagement methods utilizing, for example, Phillips or hexagonal ends may be employed. A gear 158 having a stop tooth 160 and a threaded central aperture 162 is screwed onto the smaller diameter end 154 of the tuning slug 150. A slot 164 is provided in the central aperture 162 for receiving a friction member 166. The friction member 166 extends into the central aperture 162 and engages the threaded portion 154 of the slug 150. The friction member 166 frictionally engages the threads of the end 154 to permit the slug 150 to be turned in response to a rotation of the gear 158. The slug 150 is retained in a tuning stick 168 similar to the tuning sticks described in the previously described embodiments by means of a retaining clip 170. A tongue member 172 formed integrally with the clip 170 engages the larger diameter threaded portion 152 of the tuning slug 150.

In operation, user fine tuning is accomplished in the normal fashion by engaging the gear 158 with the fine tuning mechanism of the tuner. For example, the gear 158 may be engaged by the driving pinion 38 of the fine tuning mechanism 18 of the tuner 10 shown in FIG. 1. The size and coeffecient of the friction of the friction member 166 is chosen such that the friction between the member 166 and the smaller diameter threaded portion 154 is greater than the friction between the tongue member 172 and the larger diameter threaded portion 152 of the slug 150. As a result, rotation of the gear 160 causes the tuning slug 150 to rotate. As in the previous embodiments, the engagement of the threaded portion 152 by the tongue member 172 causes the slug 150 to move axially with respect to the tuning stick 168 upon rotation of the gear 158.

Factory adjustment is provided by engaging the gear 158 with, for example, the driving pinion 38 of the fine tuning mechanism 18 and adjusting the fine tuning shaft 20 to the center of its range. The tuning shaft 20 is then held stationary to prevent the rotation of the gear 158. The factory adjustment may then be accomplished by inserting a screwdriver or the like into the slot 156 and rotating the slug 150 with respect to the gear 158 until the desired operating frequency has been achieved. Any drift from the desired operating frequency may then be compensated by the user utilizing the fine tuning mechanism 18. Should the operating frequency of the tuner drive beyond the range of the fine tuning mechanism 18, the slug 150 may be readily readjusted by a serviceman using the above described procedure.

While certain preferred embodiments of the invention have been described by way of illustration, many modifications will occur to those skilled in the art; it will be understood, of course, that it is not desired that the invention by limited thereto, since modifications may be made, and it is, therefore, contemplated by the appended claims to cover any such modifications as fall within the true scope and spirit of the invention.

What is claimed as new and desired to be secured by Letters Patent of the United States is:

1. A tuning unit for a turret type tuner comprising: an elongated body portion;
   a coil wound around said body portion;
   a threaded tuning slug having an end extending from one end of said body portion, said tuning slug being rotatable with respect to said body portion for adjusting the impedance of said coil; and
   a circular gear having a plurality of teeth including a stop tooth affixed to the end of said tuning slug extending from said body portion, wherein said tuning slug is affixed to said gear for rotation therewith upon rotation of said gear, and wherein said tuning slug is rotatable with respect to said gear when said gear is constrained.

2. A tuning unit as recited in claim 1 wherein said gear is threadingly affixed to said tuning slug.

3. A tuning unit as recited in claim 2 wherein said gear member includes a friction member for engaging said threaded tuning slug.

4. A tuning unit as recited in claim 3 wherein said tuning slug includes means extending therefrom to permit said slug to be engaged and rotated with respect to said gear member.

5. A tuning unit as recited in claim 4 wherein one end of said tuning slug has a slot defined therein.

6. A tuning unit for a turret type tuner comprising:
   an elongated body portion having interior walls defining an elongated chamber within said body portion;
   a coil wound around said body portion;
   a threaded tuning slug having an end extending from one end of said body portion, said tuning slug being axially movable with respect to said coil and rotatable with respect to said body portion for adjusting the impedance of said coil;
   a circular gear having a plurality of teeth including a stop tooth affixed to the end of said tuning slug extending from said body portion; and a resilient elongated sleeve having an interior surface for engaging said threads and an exterior surface for slidingly engaging said interior walls to permit axial movement of said tuning slug with respect to said coil.

7. A tuning unit as recited in claim 6 wherein said stop tooth is wider than the other ones of said plurality of teeth.

8. A tuning unit as recited in claim 6 wherein said stop tooth is longer than the other ones of said plurality of teeth.

9. A tuning unit as recited in claim 6 further including means engaging said body portion for resiliently engaging one of said threads, said resilient engaging the means being deflectable by said threads upon the application of axial force to said slug to permit axial movement of the tuning slug.

10. A tuning unit as recited in claim 9 wherein said resilient engaging means includes a clip attached to said body portion, said clip having a resilient tab member extending therefrom and engaging said tuning slug.

11. A tuning unit as recited in claim 6 wherein said coil is mounted for longitudinal movement along said elongated body member.

12. In a VHF tuner of the type having a plurality of tuning elements, each operative to tune said tuner to receive signals on one of a plurality of discrete frequency receiving channels, each tuning element being tunable over a predetermined range for adjusting the frequency of one of said receiving channels, and means for selectively electrically coupling one of said tuning elements in operating relationship with said tuner, a limited range fine tuning system comprising:

a plurality of rotatable frequency adjusting members, each extending from one of said tuning elements, the rotation of each of said adjusting members being effective to tune one of said tuning elements over a predetermined range for varying the frequency of one of said receiving channels;

a plurality of gears, one of said gears being attached to each of said frequency adjusting members for rotation therewith, each of said gears having a plurality of teeth including a stop tooth for limiting the range of rotation thereof, each of said gears being further mounted for rotation with respect to the one of said frequency adjusting members to which it is attached;

a fine tuning shaft; and means for selectively mechanically coupling one of said gears to said fine tuning shaft, said selective mechanical coupling means including a drive gear for selectively engaging one of said gears for rotation in response to the rotation of said fine tuning shaft, said drive gear being engageable by the stop tooth of the gear engaged thereby for limiting the range over which said engaged gear may be rotated by said fine tuning shaft.

13. A fine tuning system as recited in claim 12 wherein each of said gears is threadingly attached to a respective one of said frequency adjusting members to permit independent rotation of each of said gears and each respective one of said frequency adjusting members.

14. A limited fine tuning range turret type VHF television tuner comprising:

a plurality of electrical contacts;

a rotatable turret rotation of which is effective to tune said tuner to a plurality of predetermined discrete frequencies, each discrete frequency being associated with one of the television channels in the VHF band;

a plurality of tuning units, each associated with one of the television channels in the VHF television band, affixed to said turret for rotation therewith, said turret being operative selectively to bring one of said tuning units into electrical contact with said electrical contacts thereby to select one of said discrete frequencies, each of said tuning units having a body portion and a variable impedance unit supported by said body portion, each of said variable impedance units having a rotatable shaft extending therefrom for adjusting the impedance of that variable impedance unit to thereby alter one of said discrete frequencies over a predetermined range;

a plurality of driven gear members each affixed to one of said rotatable impedance adjusting shafts for rotation therewith, each of said driven gear members having a plurality of teeth including a stop tooth; and fine tuning apparatus including a fine tuning shaft and a drive gear responsive to said fine tuning shaft for selectively engaging for rotation the driven gear member affixed to the impedance adjusting shaft of the tuning unit that is in electrical contact with said electrical contacts, said drive gear having a plurality of teeth for meshing with the teeth of said driven gear, the teeth of said drive gear member being engagable by the stop tooth of the driven gear member engaged by said drive gear for limiting the range over which each impedance adjusting shaft may be rotated by said fine tuning apparatus to a limited range within said predetermined range, said limited range being less than said predetermined range.

15. A tuner as recited in claim 14 wherein each rotatable impedance adjusting shaft is axially movable with respect to a respective one of said tuning units, the axial movement of each rotatable impedance adjusting means being effective to adjust the impedance of each respective tuning unit independently of the rotation of said impedance adjusting means.

16. A tuner as recited in claim 14 wherein each of said gear members is threadingly affixed to a respective one of said rotatable means to permit independent rotation of each of said gear members and each of said rotatable means.

17. A tuner as recited in claim 14 wherein each of said tuning units includes a coil, and each of said rotatable impedance adjusting shaft includes a tuning slug.

18. A tuner as recited in claim 17 wherein each of said coils includes an oscillator coil.

19. A tuner as recited in claim 17 wherein each of said tuning slugs is axially movable with respect to a respective one of said coils.

20. A tuner as recited in claim 17 wherein each of said coils is axially movable with respect to the body portion of a respective one of said tuning units.

* * * * *